United States Patent [19]
Seidel

[11] 3,732,502
[45] May 8, 1973

[54] DISTORTION COMPENSATED ELECTROMAGNETIC WAVE CIRCUITS

[75] Inventor: Harold Seidel, Warren, N.J.

[73] Assignee: Bell Telephone Laboratories, Incorporated, Murray Hill, Berkeley Heights, N.J.

[22] Filed: June 17, 1971

[21] Appl. No.: 154,017

[52] U.S. Cl. ....................330/149, 330/151
[51] Int. Cl. ....................H03f 1/26
[58] Field of Search ....................330/149, 151; 328/163

[56] References Cited

UNITED STATES PATENTS

| | | | |
|---|---|---|---|
| 3,460,051 | 8/1969 | Bray | 330/149 X |
| 2,367,116 | 1/1945 | Goldsmith | 330/149 X |
| 3,624,534 | 11/1971 | Clayworth | 330/149 X |
| 3,042,867 | 7/1962 | Thompson | 330/149 X |
| 3,213,387 | 10/1965 | Snijders | 330/149 X |
| 3,525,052 | 8/1970 | Clark | 330/149 |

*Primary Examiner*—Roy Lake
*Assistant Examiner*—James B. Mullins
*Attorney*—R. J. Guenther et al.

[57] ABSTRACT

This application described predistortion and postdistortion compensation arrangements wherein compensation is restricted to the nonlinear portion of the transfer characteristic of the network to be linearized. Accordingly, the compensating signal components employed correspond solely to the distortion components of the transfer characteristic. To avoid dispersion effects, the dynamic characteristics of the compensating networks and the network to be linearized are substantially independent of time.

7 Claims, 7 Drawing Figures

INVENTOR
H. SEIDEL
BY
Sylvan Sherman
ATTORNEY

DISTORTION COMPENSATED ELECTROMAGNETIC WAVE CIRCUITS

This invention relates to arrangements for elimination signal distortion in electromagnetic wave circuits.

BACKGROUND OF THE INVENTION

Predistortion and postdistortion techniques, for canceling the distortion introduced by the nonlinear transfer characteristic of an electromagnetic wave device, such as an amplifier, are well known. Examples of such circuits are given in U.S. Pat. Nos. 2,776,410; 2,999,986; and 3,383,618. These techniques, however, have not been widely employed heretofore because of the unsatisfactory results that have been obtained. The reasons for this failure are varied. For example, in reference U.S. Pat. No. 2,999,986, a multiplicative process is used wherein the predistortion circuit is in cascade with the input to an amplifier. As a consequence, the predistortion circuit must have the same dynamic range as the amplifier and must have a transfer characteristic that is equal to the reciprocal of the transfer characteristic of the amplifier over this entire dynamic range. The likelihood of satisfying this requirement is slight. Indeed, deviations from the required correction may easily be greater than the initial nonlinearity sought to be corrected.

In the other two patents noted, an additive process is employed wherein a portion of an amplifier output signal, is extracted from the signal path, operated upon, and then reinserted into the signal path in such a manner as to reduce the overall signal distortion. However, in each instance, a component of the linear portion of the signal is also fed back into the signal path, reducing the net output signal. In addition, by operating upon the output signal, a correction circuit having a relatively large power handling capability is required. Finally, in each, a single correction circuit is used as a means of simultaneously correcting all orders of nonlinearity.

In addition to the above, there is an apparent failure to appreciate the part played by time.

SUMMARY OF THE INVENTION

The present invention is based upon the recognition that the combined dynamic interaction of two nonlinear networks can be constant only if the static transfer characteristic and the dynamic characteristic of each are substantially the same. This implies first that for each network, the resulting distortion is a function solely of the input signal, and is not a composite of the input signal and internal signal components stored within the network. That is, neither network has a stored interaction memory of any significance.

A second implication is that the frequency dispersion is sufficiently small that a one-to-one correspondence between the input signal events and the output signal events is maintained within defined limits.

It is further recognized that compensation of a nonlinear network should be limited solely to the nonlinear portion of the network transfer characteristic. So limited, there is no possibility of the compensating network introducing spurious nonlinearities over the otherwise linear portion of the principal network transfer characteristic Accordingly, predistortion or postdistortion compensation, in accordance with the present invention, comprises means for extracting a small portion of the input signal and for separately generating canceling distortion components corresponding solely to the distortion components of the principal network transfer characteristic. In postdistortion cancellation, the compensating signal components are injected into the principal network output circuit. This, however, requires additional gain in the compensating networks. Advantageously, predistortion compensation is utilized wherein the compensating signal components are injected into the input circuit of the principal network and any gain associated with the latter is simultaneously applied to both the signal and the correction components. This technique is only available, however, where the networks are free of signal interaction storage, as explained hereinabove.

DETAILED DESCRIPTION

Figure 1:
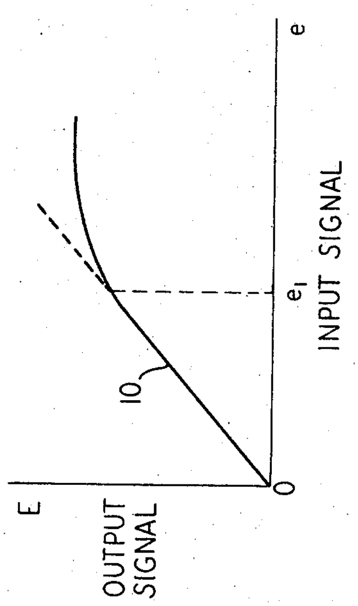
FIG. 1 shows a typical, nonlinear input-output characteristic.

Referring to the drawings, FIG. 1 shows an input-output curve 10, such as might illustrate the transfer characteristic of an amplifier or the like. Typically, such curves are acceptably linear over a region from zero to some input signal level $e_1$, and then tends to depart from linearity beyond this level due to saturation effects. Expressed as a Taylor series expansion, the relationship between the input signal $e$, and the output signal E is given by $$E = a_o + a_1 e + a_2 e^2 + a_3 e^3 \ldots a_n e^n \qquad (1)$$

where the coefficients $a_o, a_1 \ldots a_n$ are constants and $e = e_o \sin \omega t$.

It should be noted that curves of the type illustrated are usually obtained empirically, on a point-by-point basis and, as such, are more properly identified as static representations of the amplifier transfer characteristic. Similarly, the Taylor expansion for this curve implies that $e$ is the actual excitation voltage. In practice, however, the system is not static. In order to convey information, some parameter of the signal, such as frequency or amplitude, is varying as a function of time and, hence, a second, or dynamic characterization of the system is required. To the extent that the amplifier has an interaction memory, caused, for example, by internal reflections or resonances, the actual excitation voltage can no longer be represented simply by $e = e_O \sin \omega t$, but must take into account all signals within the memory of the system. To this extent, the dynamic and the static characteristics of the system are different. The present invention, however, is based upon the recognition that distortion correction, based upon either predistortion or postdistortion techniques, are effective only to the extent that the dynamic characteristic of the system being corrected is substantially the same as its static characteristic.

The dynamic characteristic of the system can also be affected by its frequency dispersion. In order for the system to be capable of responding on an event-for-event basis, the dispersion must be such that the signal blurring is maintained within prescribed limits. If, for example, pulses are transmitted through an amplifier, the dispersion must be less than that which seriously equivocates the identity of the pulses. For purposes of the present invention, the static and the dynamic transfer characteristics are deemed substantially the same so long as the dispersion is such as to yield less than the order of a 10 percent overlap of adjacent pulses. Assuming, for purposes of illustration, that this overlap occurs at a bit rate F, the useful bandwidth $\Delta f$ of the amplifier, for purposes of the present invention, would be of the order of F/2.

Having thus defined the system, it is further recognized that there is no need or desire to tamper with that portion of the transfer characteristic that is linear. Typically, prior art predistortion and postdistortion circuits have sought to employ circuits whose transfer characteristics are the same as, or complementary to, the circuit being corrected. However, slight linear deviations in the correcting circuits within the linear region of the circuit to be corrected may well introduce significant distortion where none existed heretofore. Accordingly, in accordance with the present invention, distortion correction is limited to the nonlinear portion of the transfer characteristic or, what is equivalent to the higher order terms of the Taylor series. Thus, referring again to FIG. 1, predistortion and postdistortion compensation, in accordance with the present invention, involves compensating the system transfer characteristic solely over the curved region beyond $e_1$.

Figure 2:
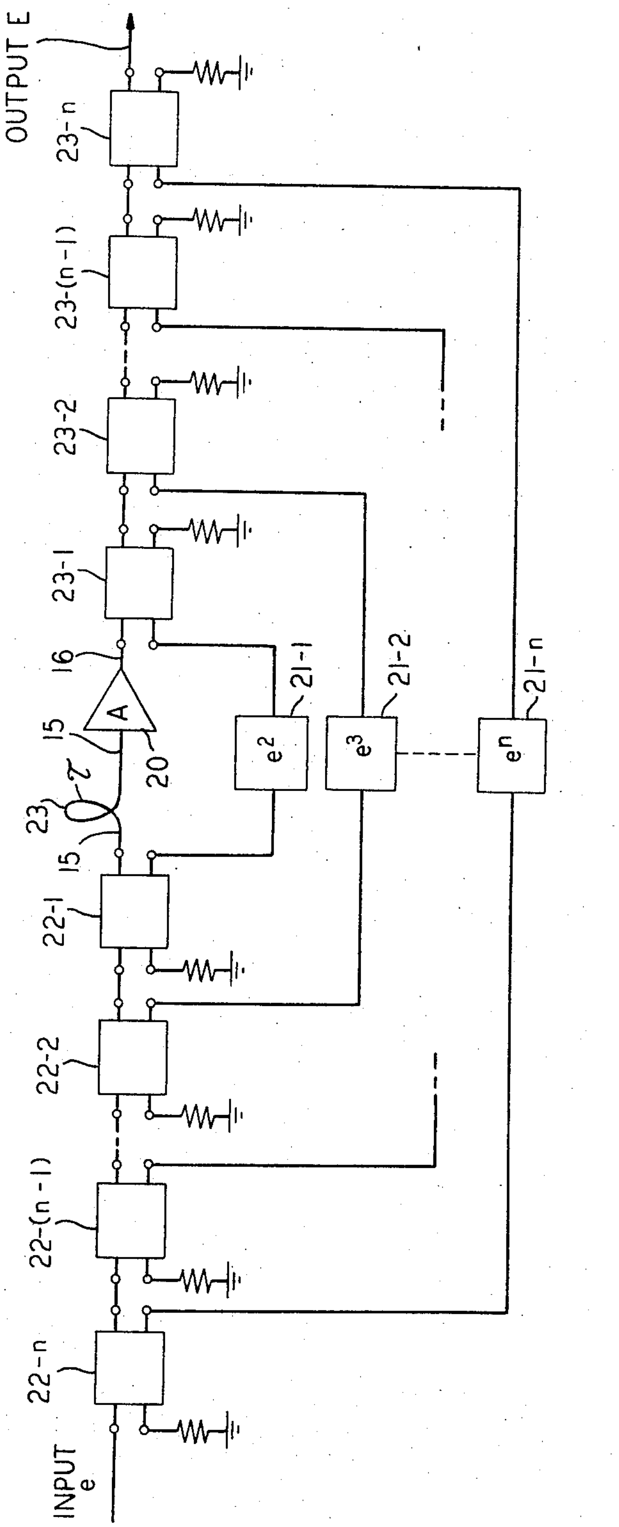
FIG. 2 shows, in block diagram, a first embodiment of the invention, employing postdistortion correction.

FIG. 2, now to be considered, shows in block diagram, a first embodiment of the invention employing postdistortion correction. For purposes of illustration, the network to be corrected is an amplifier 20 whose dynamic transfer characteristic can be represented by the Taylor series given by equation (1). Thus, amplifier 20 has no internal reflections having a finite memory and is preferably matched as both its input and output ends. While illustrated as a single stage, it should be noted that amplifier 20 can include one or more stages and can also include equalization networks for maintaining the overall frequency dispersion below the limits defined hereinabove.

Correction is accomplished by means of one or more shunt-connected compensating networks 21–1, 21–2 . . . **21–*n* whose dynamic and static transfer characteristics are essentially the same. Thus, the correcting networks are similarly free of internal reflections having a finite memory, and are similarly advantageously matched at their respective input and output ends. Each of the networks is adapted to compensate for one of the higher order distortion terms characteristic of amplifier 20. Thus, network 21–1 generates a second order, $e^2$ term which, when injected into the main signal path, cancels the $e^2$ distortion term of amplifier 20. Network 21–2 is adapted to cancel the $e^3$ distortion term while, in general, network 21–*n*** is adapted to cancel the $e^n$th order distortion term.

The various input signal for the compensating networks are obtained by means of a plurality of power dividers 22–1, 22–2 . . . 22–n, or by a single *n*-fold power divider, located in the input circuit 15 of amplifier 20. Each extracts a very small portion of the input signal and couples it to its respective compensating network. The resulting compensating signals are then injected back into the main signal path. In the illustrative embodiment of FIG. 2, the compensation is made in the output circuit 16 of amplifier 20 by means of injection networks 23–1, 23–2 . . . 22–n, and, hence, illustrates a postdistortion correction system.

It will be noted that none of the compensating networks includes, as part of its output, a linear term *e*. Thus, as explained hereinabove, there is no modification of the linear portion of the amplifier by any of the compensating networks and, therefore, no possibility of any error in the latter degrading the linearity of the former.

Recognizing that the time delay through the compensating network may differ from the delay in the transmission path to amplifier 20, a delay network 24 is included between the sampling power dividers 22 and amplifier 20. Additional delay networks (not shown) can also be included in the respective compensating network circuits, as required.

Figure 3:
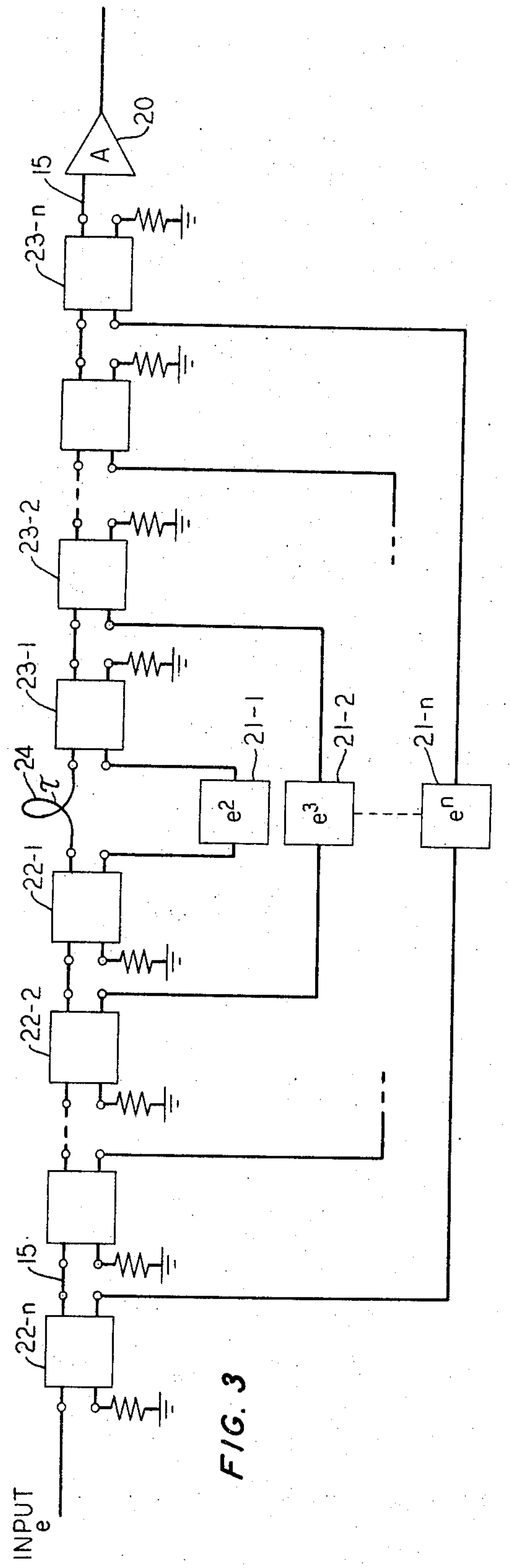
FIG. 3 shows, in block diagram, a second embodiment of the invention, employing predistortion correction.

FIG. 3 shows a second embodiment of the present invention wherein the compensating signals are injected into the main signal path at the input to the amplifier, thus defining a predistortion compensating system. Using the same identification numbers as in FIG. 2 for corresponding components, the embodiment of FIG. 3 includes an amplifier 20 to be compensated, and a plurality of shunt-connected compensating networks 21–1, 21–2 . . . **21–*n*. A small sample of the input signal is coupled from the main signal path 15 to the respective compensating networks by means of signal dividers 22–1, 22–2 . . . 22–*n*. The compensating signals are, in turn, coupled back into the main signal path by means of signal injection networks 23–1, 23–2 . . . 23–*n***.

Except for the level of the compensating signals produced, the compensating networks of FIGS. 2 and 3 are basically the same. In the embodiment of FIG. 3, the gain of amplifier 20 is used, in common, by all of the compensating signals to cancel the amplifier nonlinearities. In the embodiment of FIG. 2, each of the compensating networks develops, individually, a signal of sufficient magnitude to cancel the amplifier nonlinearities at the output level of amplifier 20. That the compensating signals can be injected at either the input end or at the output end of amplifier 20, derives from the fact that neither the amplifier nor the compensating networks has a stored interaction memory. As such, the harmonics formed undergo no significant dispersion and, hence, the dynamic interaction of the two entities is indifferent to the sequence of their interaction.

Figure 4:
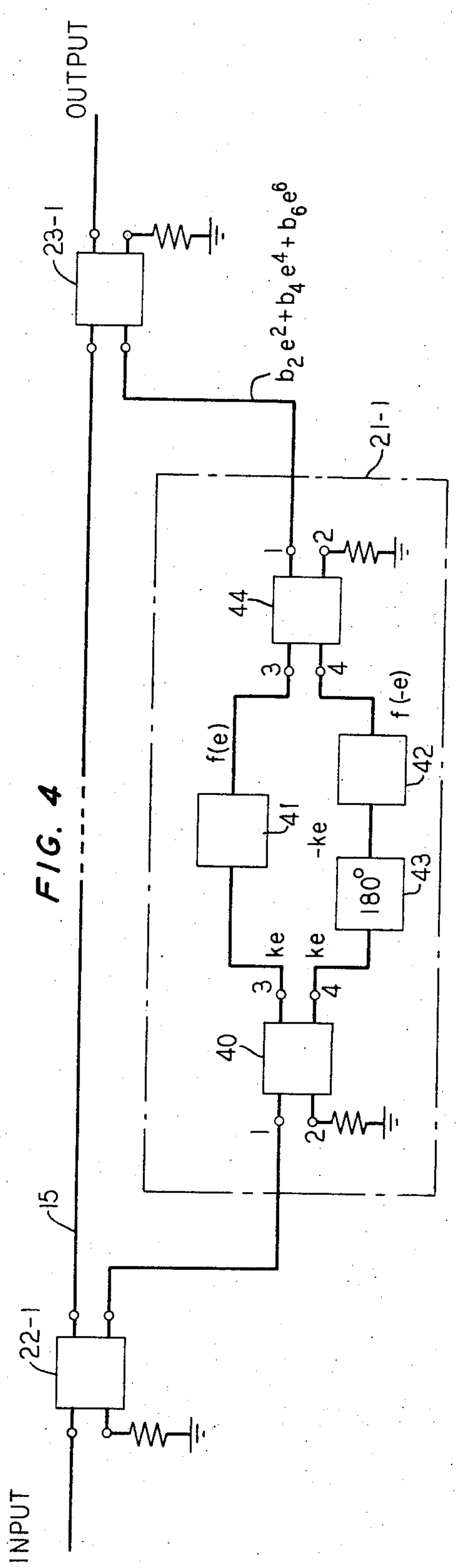
FIGS. 4–6 shows, in some detail, illustrative arrangements for obtaining various compensating signals.
Figure 5:
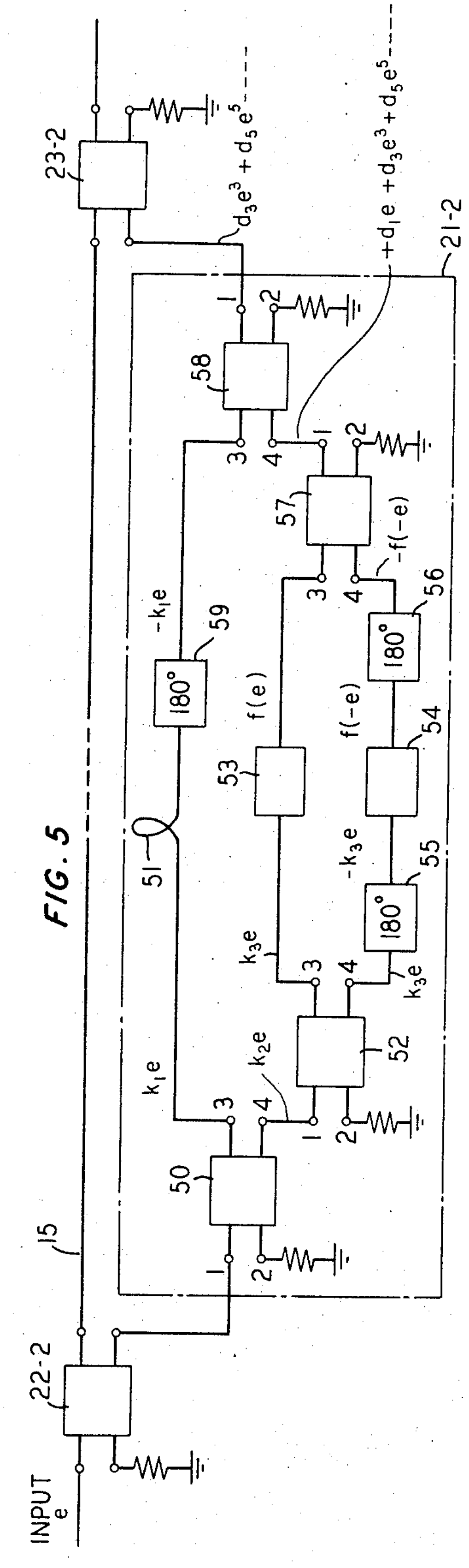
Figure 6:
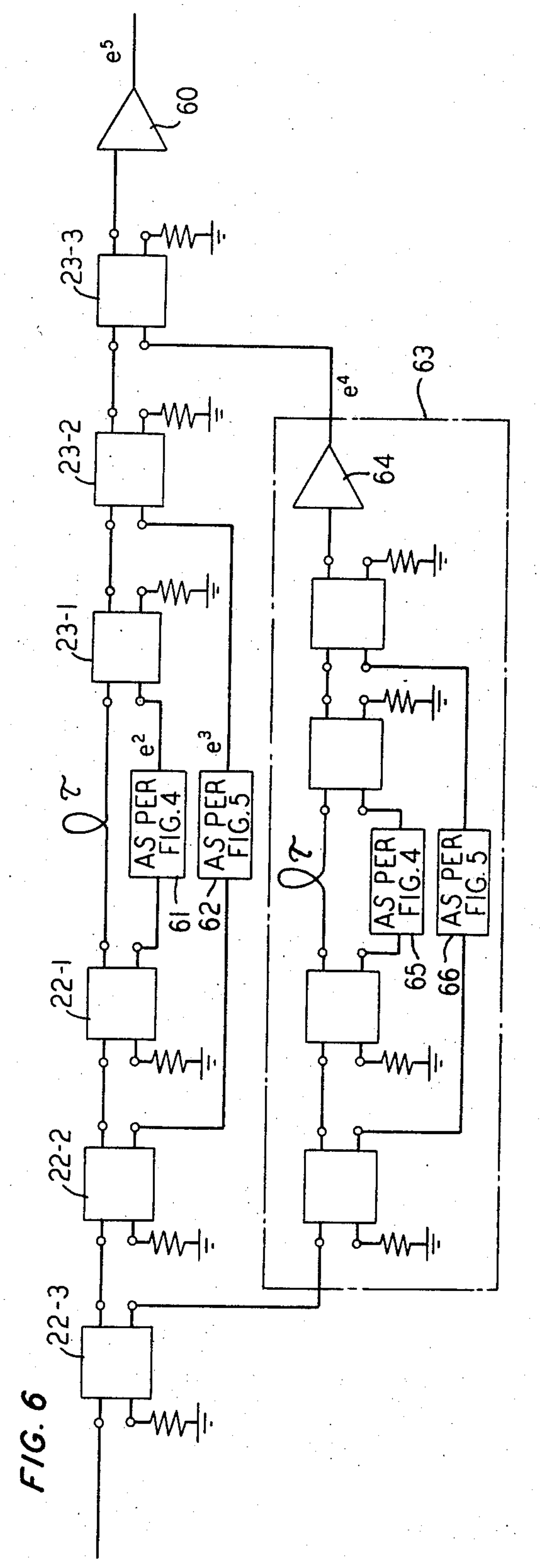

FIGS. 4 to 6, now to be described, show in some detail, illustrative arrangements for obtaining the various compensating signals. The first of these, FIG. 4, shows network 21–1 for generating the second order correction term $e^2$. This circuit comprises a power divider 40 having one output port 3 coupled to a first nonlinear network 41 and having its other output port 4 coupled to a second, identical nonlinear network 42 through a 180° phase shifter 43. The output from networks 41 and 42 are combined by means of a suitable power combiner 44.

In operation, a portion of the input signal $e$ is coupled by means of power divider 22–1, out of the main signal path 15 to port 1 of power divider 40. The latter divides this portion into two, substantially equal components $ke$, that are proportional to the input signal. A first component, applied to network 41, produces an output signal $f(e)$ given by $$f(e) = c_1e + c_2e^2 + c_3e^3 \ldots \quad (2)$$

The second component is reversed 180° in phase by phase shifter 43 to produce a signal $-ke$ which, when applied to network 42, produces an output signal $f(-e)$ given by $$f(-e) = -ce + c_2e^2 - c_3e^3 \ldots \quad (3)$$

The sum of these two signals, at the output of power combiner 44 is then $$f(e) + f(-e) = b_2e^2 + b_4e^4 + b_6e^6 \ldots \quad (4)$$

It will be noted that this sum includes only even order terms. In particular, the amplitude and phase of this signal is adjusted such that the second order term $b_2e^2$ cancels the second order distortion term generated by amplifier 20. The higher order terms in the compensating signal are typically small enough to be neglected. However, if they are significant, they merely add to the distortion produced by amplifier 20 and are part of the signal that must be compensated.

FIG. 5 shows one embodiment of circuit 21–2 for generating a third order correction term. This circuit comprises a first power divider 50, one of whose output ports 3 is connected to a delay network 51, and whose other output port 4 is connected to input port 1 of a second power divider 52. Output port 3 of divider 52 is connected to a first nonlinear network 53. Output port 4 of divider 52 is connected to a second, substantially identical nonlinear network 54 through a first 180° phase shifter 55. The output from network 53 is coupled to input port 3 of a first power combiner 57. Similarly, the output from network 54 is coupled to input port 3 of combiner 57 through a second 180 degree shifter 56. Output port 1 of combiner 57 and the output from delay network 51 are connected, respectively, to input ports 4 and 3 of a second power combiner 58.

In operation, a small portion of input signal $e$ is coupled to port 1 of power divider 50 by means of power divider 22–2. The former divides this portion of signal into two components $k_1e$ and $k_2e$, which are coupled respectively to delay network 51, and to port 1 of power divider 52, wherein it is further divided into two equal components $k_3e$. One of these latter components is coupled to nonlinear network 53 which produces an output signal $f(e)$ given by $$f(e) = m_1e + m_2e^2 + m_3e^3 \ldots \quad (5)$$

The other $k_3e$ component is reversed in phase by phase shifter 55 to produce a signal $-k_3e$ which, when coupled to nonlinear network 54, produces an output signal $f(-e)$ given by $$f(-e) = -m_1e + m_2e^2 - m_3e^3 \ldots \quad (6)$$

The latter signal is then reversed in phase by phase shifter 56 such that the signal coupled to port 4 of power combiner 57 is given by $$-f(-e) = m_1e - m_2e^2 + m_3e^3 \ldots \quad (7)$$

This signal is then combined with the signal from network 53 in power combiner 57 to produce an output signal $F(e)$ given by $$F(e) = f(e) - f(-e) = m_1e + m_3e^3 + m_5e^5. \quad (8)$$

It will be noted that $F(e)$ includes a linear component $m_1e$. As indicated hereinabove, the correction networks produce solely higher order signal components and, hence, the linear term must be removed. This is done in signal combiner 58, which adds the linear component $-k_1e$ from phase shifter 59 and the output signal from signal combiner 58 to produce an output signal $$F'(e) = m_3e^3 + m_5e^5 \ldots \quad (9)$$

having only the higher, odd order terms. In particular, the amplitude and phase of this signal is adjusted such that the third order term $m_3e^3$ cancels the third order distortion component generated by amplifier 20.

For most applications, the terms higher than the third are sufficiently small and can be neglected. However, in principle, the process can be continued, canceling as many of the higher order terms, in turn, as is deemed necessary for the particular application at hand. The manner in which this can be done is illustrated in FIG. 6. Using a predistortion arrangement, second and third order distortion components in amplifier 60 are eliminated by means of compensating networks 61 and 62, respectively, where network 61 is as shown in FIG. 4, and network 62 is as shown in FIG. 5. In the absence of any further compensation, the output from amplifier 60 would have a fourth order component as the lowest order distortion term. Thus, to eliminate this term, a fourth order compensating network 63, which is a replica of the previously described portion of the circuit, is used. That is, the fourth order compensating network 63 includes an amplifier 64 that has been compensated by a second order compensating network 65 and a third order compensating network 66 such that the lowest order distortion term in its output is of the fourth order. More generally, any amplifier, compensated to the $n^{th}$ order can itself be used as the $n^{th}$ order compensating network to produce an amplifier compensated to the $(n+1)^{st}$ order. Thus, amplifier 64, compensated to the $4^{th}$ order, is used to compensate amplifier 60 to the $5^{th}$ order.

While a "linear" amplifier is generally understood to be one free of all significant distortion, in a practical situation some distortion of considerable magnitude can be tolerated. For example, wideband transmission circuits are frequently used to simultaneously transmit information in a number of different frequency channels. If the amplifiers in the system were perfectly linear, each of the channels would be transmitted independently of the others. However, because the amplifiers are not completely linear, there is mixing of the signals, giving rise to what is termed intermodulation distortion, or "cross-talk." More particularly, in a system operating between frequencies $f_l$ and $f_\mu$, the second order distortion term gives rise to sum and difference frequencies, and second harmonic terms, all of which typically fall outside the passband between $f_l$ and $f_\mu$. When this is the case, it is obviously unnecessary to provide second order correction. Third order distortion, on the other hand, gives rise to terms of the type $2f_1 - f_2$, where $f_1$ and $f_2$ are two of the channel carrier frequencies. Since intermodulation components of this frequency fall well within the passband, third order compensation is advantageously applied. Higher order distortion terms that may give rise to intermodulation components within the passband are generally small enough to be neglected.

Figure 7:
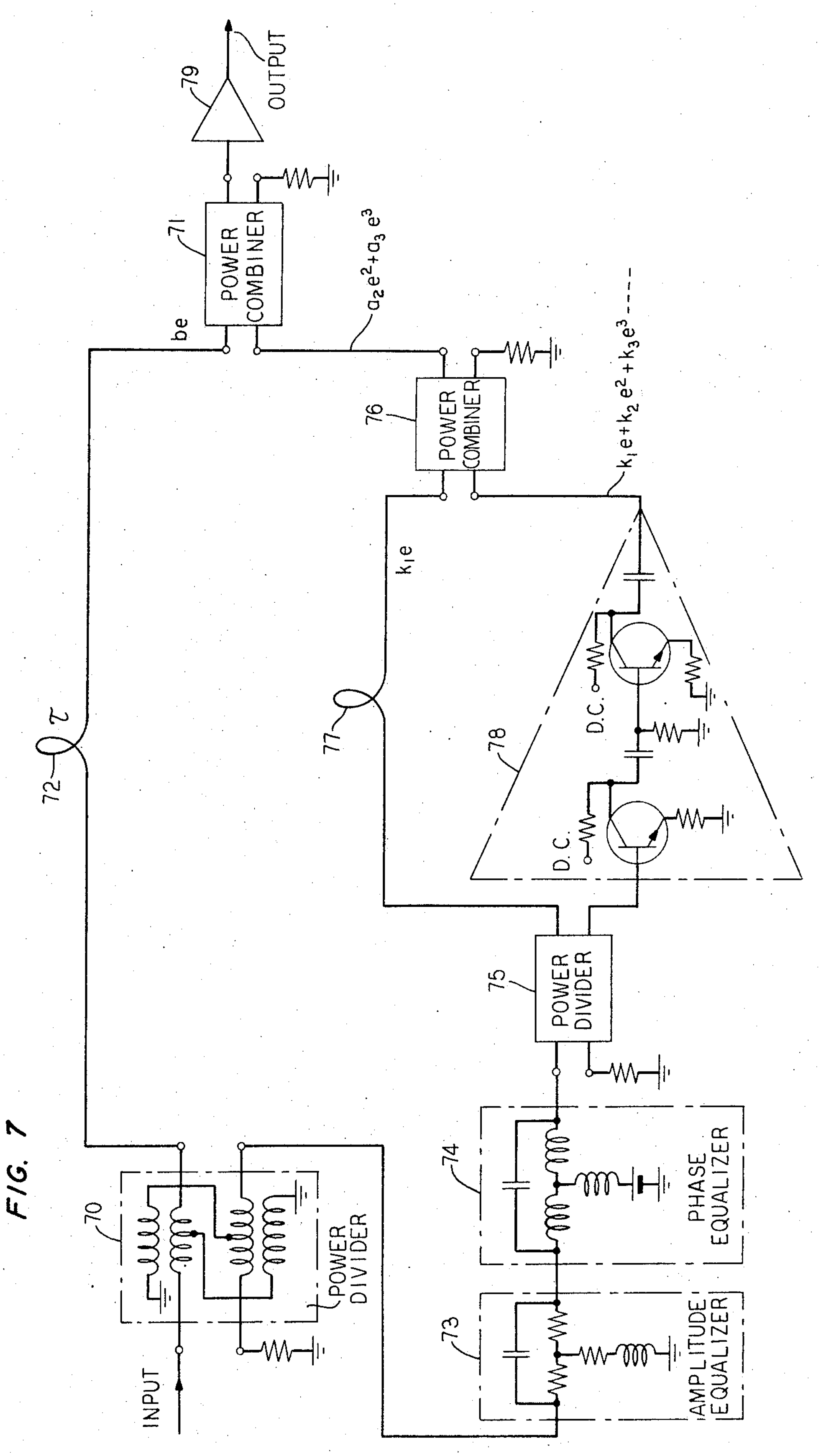
FIG. 7 shows an embodiment of the invention for minimizing third order distortion effects.

FIG. 7, now to be considered, shows, in some detail, a distortion compensated circuit that was built to minimize third order intermodulation distortion. The circuit comprises an input power divider 70 for dividing the input signal into two components. (For this and other power dividing and power combining functions, hybrid transformers were used.) One component of signal is coupled to a power combiner 71 by means of a time delay network 72. The second signal component is coupled through an amplitude equalizer 73 and a phase equalizer 74, to a second power divider 75. The latter divides the second signal component into third and fourth components, one of which is coupled to a second power combiner 76 through a second time delay network 77. The fourth signal component is coupled to power combiner 76 through a distortion network 78 comprising two R-C coupled transistor amplifiers. The output from the latter, which includes first as well as higher order signal components, is combined in power combiner 76, with that portion of the input signal that has been delayed in delay network 77 so as to cancel the first order term. Thus, the output from power combiner 76, which is injected into the input port of amplifier 79 by means of power combiner 71, only includes the higher order distortion components. However, since it is the third order intermodulation that is to be minimized, it is only the amplitude and phase of the third order term $k_3e^3$ that is important. If the distortion in amplifier 79 is constant over the frequency band of interest, only one amplitude and phase adjustment is required. It was found, however, that this is not generally the case, but that some moderate departure both in gain and phase does occur. Accordingly, amplitude and phase equalizers 73 and 74 are advantageously included in the distortion network to provide the proper amplitude and phase for the third order term over the band of interest.

It will be recognized that the above-described arrangements are illustrative of but a small number of the many possible specific embodiments which can represent applications of the principles of the invention. Numerous and varied other arrangements can readily be devised in accordance with these principles by those skilled in the art without departing from the spirit and scope of the invention.

What is claimed is:

1. In combination:

an electromagnetic wave circuit having a nonlinear dynamic transfer characteristic;

means coupled to the input of said circuit for extracting a portion of any input signal coupled to said circuit;

means, using said extracted portion of input signal, for generating compensating distortion components corresponding solely to the higher order terms of said transfer characteristic; and means for injecting said components back into said circuit.

2. The combination according to claim 1 wherein the dynamic transfer characteristic of said circuit and the combined dynamic transfer characteristic of said extracting, said generating and said injecting means are proportional to each other.

3. The combination according to claim 1 wherein said compensating components are injected into the input end of said circuit.

4. The combination according to claim 1 wherein said compensating components are injected into the output end of said circuit.

5. The combination according to claim 1 wherein said circuit is an amplifier.

6. The combination according to claim 1 wherein the transfer characteristic of said circuit can be expressed by $$E = a_o = a_1e + a_2e^2 + a_3e^3 \ldots$$

where $e$ is the input signal;

$E$ is the output signal;

and $a_o, a_1, a_2 \ldots$ are constants;

and wherein different means are employed to generate each higher order distortion term of said transfer characteristic that is to be canceled.

7. In combination:

an electromagnetic wave circuit having a nonlinear dynamic transfer characteristic;

means, coupled to the input of said circuit, for extracting a portion of any signal applied to said circuit;

means for coupling components of said extracted portion of input signal to nonlinear networks, each of whose outputs includes a first order signal component and distortion components corresponding to the higher order terms of said transfer characteristic;

means for canceling the first order signal component from the output of each of said networks; and means for injecting said remaining distortion components back into said circuit to minimize the distortion introduced by said nonlinear transfer characteristic.

* * * * *